United States Patent [19]

Studley et al.

[11] Patent Number: 4,932,358
[45] Date of Patent: Jun. 12, 1990

[54] PERIMETER WAFER SEAL

[75] Inventors: David K. Studley; Ernest Keller, both of Sunnyvale, Calif.

[73] Assignee: Genus, Inc., Mountain View, Calif.

[21] Appl. No.: 354,636

[22] Filed: May 18, 1989

[51] Int. Cl.⁵ .............................................. C23C 16/00
[52] U.S. Cl. .................................... 118/728; 118/500; 118/721; 427/248.1; 427/282
[58] Field of Search ............... 118/500, 719, 720, 721, 118/728, 729; 156/345; 204/298; 427/255.5, 282, 248.1

[56] References Cited

U.S. PATENT DOCUMENTS

| | | | |
|---|---|---|---|
| 3,897,324 | 7/1975 | Del Monte et al. | 204/298 |
| 4,113,547 | 9/1978 | Katz et al. | 118/728 |
| 4,373,470 | 2/1983 | Martin | 118/720 |
| 4,592,308 | 6/1986 | Shih et al. | 118/728 |
| 4,599,970 | 7/1986 | Peterson | 118/728 |
| 4,676,193 | 6/1987 | Martin | 118/720 |
| 4,777,909 | 10/1988 | Martin | 118/720 |

FOREIGN PATENT DOCUMENTS

| | | | |
|---|---|---|---|
| 62-146254 | 6/1987 | Japan | 118/720 |
| 62-164866 | 7/1987 | Japan | 118/720 |
| 62-164867 | 7/1987 | Japan | 118/720 |

Primary Examiner—Richard Bueker
Assistant Examiner—Terry J. Owens
Attorney, Agent, or Firm—Joseph H. Smith

[57] ABSTRACT

A seal ring presses against a wafer on a CVD chuck continuously around the outer periphery of the wafer, and with sufficient force to hold the backside of the wafer against the chuck, so no CVD material may deposit on the backside of the wafer. The seal ring has one surface for contacting the frontside of the wafer and a second surface that extends close to the CVD chuck, so the edge of the wafer is also excluded from CVD coating. With use of the wafer seal ring apparatus and method, CVD coating is confined to the frontside of a wafer. In a preferred embodiment, an apparatus with a slide operated by a cam lever and a tension spring for moving the seal ring and pressing it against a wafer on a CVD chuck is used with each of multiple chucks attached to a rotatable turret within a CVD chamber.

13 Claims, 6 Drawing Sheets

PERIMETER WAFER SEAL

FIELD OF THE INVENTION

The present invention is in the area of apparatus for accomplishing chemical vapor deposition (CVD) processes on wafers as a manufacturing step in producing integrated circuits.

BACKGROUND OF THE INVENTION

Manufacturing of integrated circuits is generally a procedure of forming thin films and layers of various materials on wafers of base semiconductor material, and selectively removing areas of such films to provide structures and circuitry. Doped silicon is a typical base wafer material. Chemical vapor deposition is a well known process for depositing such thin films and layers. For example, silicon may be deposited from silane gas, $SiH_4$. It is known, too, to deposit tungsten silicide from a mixture of gases including silane and a tungsten-bearing gas such as tungsten hexaflouride. Pure tungsten is also deposited on silicon wafers in the manufacture of integrated circuits.

In a typical chemical vapor deposition process wafers are placed on supports within a sealable chamber, the chamber is sealed and evacuated, the wafers are heated, typically by heating the wafer support, and a gas mixture bearing the desired material to be coated is introduced into the chamber. The temperature of the wafer material at the surface to be coated causes the desired coating material to form on the surface from the gas mixture. It is important to control the temperature, the concentration of various gases in the mixture introduced, and such characteristics as the uniformity of flow of gas over the surface being coated.

In most cases, active structures and circuitry are formed on one side of a wafer, and the other side is not so used. The side not so used is called the backside of the wafer. In lithography procedures for defining patterns on deposited layers to aid in the proper selective removal of such deposited layers to form structures and circuitry, the backside of a wafer is typically used as a registering surface. For this and other reasons it is important that the backside of a wafer be kept smooth and clean, and that, in general, material not be deposited on the backside.

Another important characteristic in layering techniques is that the deposited layers be adherent to the base wafer material or to the next underlying layer, so layered material doesn't flake or peel. The dimensions of structures and circuitry in integrated circuit technology are very small, so any unwanted flaking or peeling may easily spoil structures or circuitry. Moreover, flakes from a non-adherent layer of material can spoil other structures and circuitry on the same or other wafers, and also may damage sensitive equipment and require cleaning procedures beyond those that might otherwise be necessary.

To promote adhesion, it is common to deposit a layer of material known as an adhesion layer, or glue layer, in a very thin film, before depositing the required thicker layer of material. The adhesion layer in some cases is an entirely different material known to be adherent to the base material and to the new layer to be applied. Titanium is often deposited by sputtering as an adhesion layer before depositing tungsten or a tungsten rich material, such as tungsten silicide, by a chemical vapor deposition.

Sputtering is generally a line-of-sight process, in which material is emitted in substantially atomic form from a source toward a substrate, and a film of the sputtered material forms on all surfaces in line-of-sight of the source. Very little material forms on surfaces not in line-of-sight. This line-of-sight characteristic is often a disadvantage when depositing a layer of material as a process step in integrated circuit manufacture, because uneven topography of existing structures and circuitry on a wafer often causes uneven thickness of the developing sputtered layer. Chemical vapor deposition processes, on the other hand, do not have this deficiency. It has been found through trial, however, that in some cases, an initial thin sputtered layer of a material will promote adhesion of a subsequently deposited layer by chemical vapor deposition. As an example of such a procedure, it is common to sputter a thin film of titanium or other adhesion layer on a wafer prior to deposition of a blanket tungsten or a tungsten silicide layer.

FIG. 1A is a side view of a wafer 11 resting at an angle against a surface 13 within a chamber used for chemical vapor deposition. Surface 13 supports the wafer and is heated to transfer heat to wafer 11 so that when CVD gases are introduced to the chamber, material will deposit on the wafer. FIG. 1B is a front view of wafer 11 on surface 13, and shows the wafer resting on two pins 15 and 17, which is common in many CVD machines. Support at a small angle, or nearly vertical, as shown in FIG. 1A, is mostly for convenience in handling wafers. The orientation of a wafer in a CVD chamber is generally not critical to characteristics of the deposition process.

FIG. 2 is a partial section through an edge of wafer 11 and a part of heating and support surface 13 along line 2—2 of FIG. 1B. A sputtered adhesion layer 19 is shown by FIG. 2 overlaying the base wafer material 21. The adhesion layer was applied with the surface to be coated facing sputtering sources. Because of the above-described line-of-sight nature of the sputtering process, adhesion layer 19 has a relatively uniform thickness "t" over the surface of the wafer facing away from the heating and support surface 13. The thickness of the adhesion layer, however, diminishes rapidly around the edge of the wafer, and ends at point 23, which is about the midpoint of the edge of the wafer. Beyond point 23 toward surface 13, and on the backside of the wafer, there is no adhesion layer at all. This is true around the circumference of the wafer.

When a wafer with an adhesion layer applied from one side, having a thickness profile substantially as shown in FIG. 2, is placed in a CVD machine, and a CVD layer 25 is applied, the thickness profile will be substantially as shown in FIG. 2 for layer 25. The thickness of the CVD layer will be substantially uniform across the surface opposite the support and heating surface, and will extend all the way around the edge of the wafer. This even coating characteristic is because CVD is a process in which material precipitates from a gas at the surface to be coated. There is no line-of-sight phenomenon. Also, because wafers are not typically perfectly flat, there will be areas around the periphery of the wafer where the backside is not in contact with the support and heating surface. In these areas where the backside of the wafer is not flat against the heating and support surface, such as surface 27 in FIG. 2, there will be some CVD coating.

The uniformity-of-coating characteristic difference between the sputtering process, used to deposit adhesion layer 19 and the CVD process, used to deposit CVD layer 25, causes a significant problem. Because the CVD material coats beyond point 23, where the adhesion layer ends, and also on the backside of the wafer in some areas, represented by surface 27 in FIG. 2, some of the CVD material is not adherent, and will peel. The flakes from peeling are a particulate problem in process, causing such as shorts between circuit patterns, and a cleaning requirement. The flakes can also damage some sensitive processing equipment. Because the flaking is typically uneven, rather than complete and uniform, registration for lithographic procedures becomes more difficult.

One way sputtered adhesion layers are used and peeling avoided is by sputtering the adhesion layer on the backside of the wafer as well as on the frontside; and by altering the orientation of the wafer during sputtering, so the edges of the wafer are coated with the adhesion layer as well. If this is done, then the subsequent CVD layer will deposit on an underlying adhesion layer in all areas, and peeling is avoided.

A significant problem with the all-over sputtering solution is that the equipment to manipulate a wafer to coat the edges is more expensive and complicated to use than equipment to coat one side. Also the backside coating requirement substantially doubles the process cost of the step of applying the adhesion layer.

Another way that has been tried is to avoid backside coating in the CVD process is to press the wafer against the support and heating surface from the frontside. Accordingly, equipment has been built to press on a wafer at multiple points around the periphery of the wafer, near the outside diameter, in the CVD process. This point-clamping technique, however, has two significant drawbacks. Unless the wafer is backside and edge sputtered for the adhesion layer, there is still no adhesion layer over part of the wafer edge. Also, the multiple point technique does not completely elminate backside CVD coating. Wafers, like any other material, when heated substantially from one side, tend to warp and curl, and the forces are large. There are still areas that are exposed to some degree on the backside, and the potential for damage to fragile wafers is increased. The point pressure technique is relatively effective when the adhesion layer is sputtered on the edges and backside, but the disadvantages of the extra sputtering operations still has to be absorbed.

What is clearly needed is CVD apparatus and method that effectively and economically restricts CVD deposition to the frontside only of a wafer, so that expensive edge and backside sputtering of adhesion layers need not be done.

SUMMARY OF THE INVENTION

An apparatus is provided for preventing edge and backside coating on a wafer on a CVD chuck during CVD processing. The apparatus has a unique wafer seal ring mounted on a movable carrier assembly so the seal ring may be pressed against a wafer around the entire outer periphery of the wafer. The seal ring contacts the frontside of the wafer and extends close to the CVD chuck forming a perimeter proximity seal, so the wafer edge and the backside of the wafer are excluded from CVD coating. In the preferred mode, the carrier assembly is guided toward and away from the CVD chuck and moved by an actuator in the guides. In the closed position, pressure is applied to urge the wafer against the chuck. In a preferred embodiment, the apparatus is applied to a CVD system with a rotating internal hub and multiple chucks attached to the hub. In the preferred embodiment, the carrier is guided in a linear slide in journal bearings for each chuck, and a tension spring urges the carrier closed and provides the sealing pressure. The apparatus in the preferred embodiment is opened by a cam follower moving against a pivoting cam lever as the rotatable hub moves in one direction. Rotation of the hub in the opposite direction causes the pivoting cam lever to be moved so the wafer seal apparatus is not actuated.

DESCRIPTION OF THE PREFERRED EMBODIMENTS

Figure 1A:
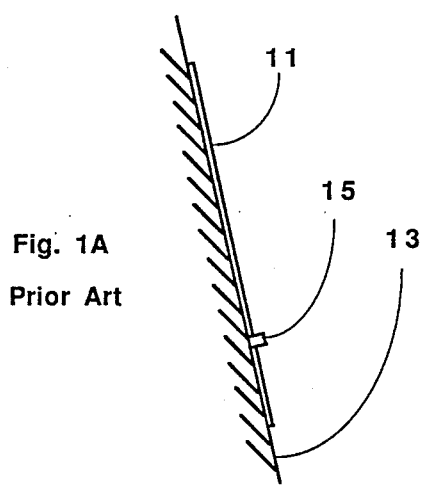
FIG. 1A is a side elevation view of a wafer supported on pins on a CVD chuck in the prior art.
Figure 1B:
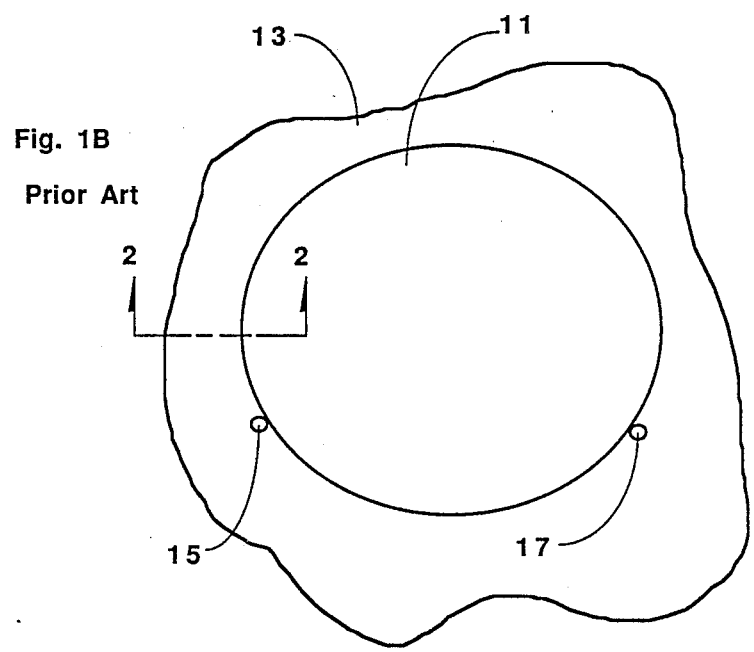
FIG. 1B is a front view of the wafer and chuck of FIG. 1A in the prior art.
Figure 2:
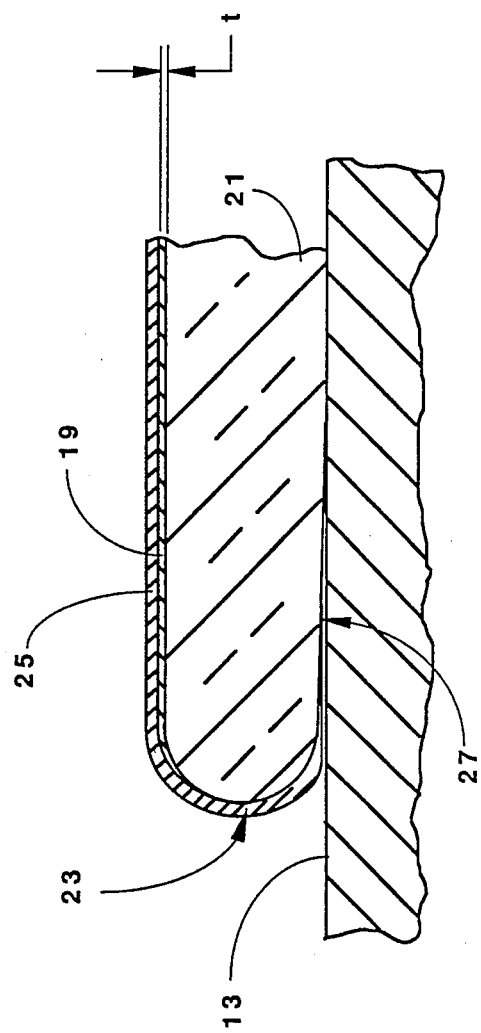
FIG. 2 is a partial section through a portion of a chuck and a wafer in the prior art showing the effect of CVD coating over a sputtered adhesion layer.
Figure 3:
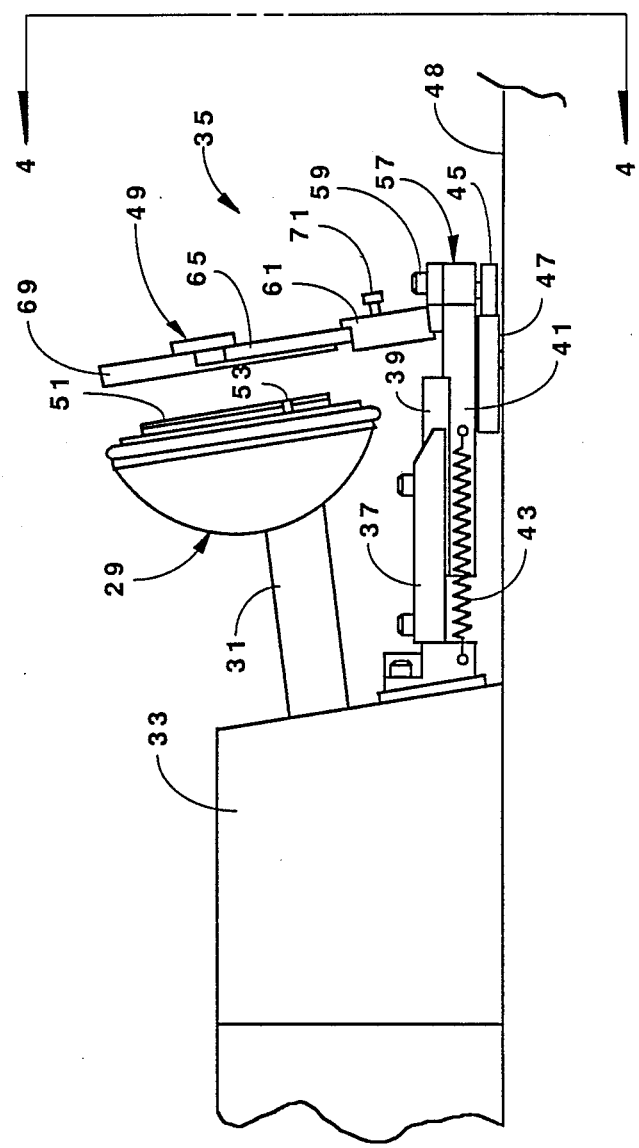
FIG. 3 is a side elevation view of a perimeter wafer seal apparatus in a preferred embodiment of the invention.

FIG. 3 is a side elevation view of a single CVD chuck 29 supported on an arm 31 from a water-cooled central hub 33 in a CVD deposition chamber. Typically utilities, such as a heater line and electrical leads to temperature sensors and other transducers used in process control are enclosed in the arm to the chuck. A wafer 51 is carried by the chuck for processing, and the wafer rests on support pins 53 and 55. Only support pin 53 is seen in FIG. 3. Isolating the chuck from the central hub reduces mass to be heated and enhances process control. Typically, several process chucks extend from a central hub, so several wafers may be processed simultaneously.

In FIG. 3, all of the volume surrounding the hub and chuck is volume within an enclosed CVD chamber. The central hub is movable rotationally, so each chuck is presented to a single opening in the chamber for automatic loading and unloading of wafers one-at-a-time. In a typical processing cycle the CVD chamber is vented to atmosphere, the hub is rotated, processed wafers are unloaded and unprocessed wafers are loaded until all chucks are occupied by unprocessed wafers, rotation is stopped, the chamber is sealed, and a CVD deposition cycle is initiated. The deposition cycle comprises heating of the chucks and introduction to the sealed chamber of CVD gases, at least one of which bears the material to be coated. There are also CVD machines in which transfer of wafers to and from the positions at which the wafers are processed is accomplished through an air-lock chamber, so the CVD processing chamber need not be exposed to atmosphere.

A perimeter wafer seal apparatus 35 according to a preferred embodiment of the present invention is shown in FIG. 3 fastened to the central hub below the CVD chuck position. The fastening arrangement includes ceramic insulators, so the wafer seal apparatus is electrically isolated from the central hub. In the preferred embodiment there is one such seal apparatus associated with each CVD chuck. From the point where the seal apparatus is fastened to the central hub, a mounting arm 37 extends in the direction of the chuck and carries a guide apparatus 39. A support member 41 is engaged in guide apparatus 39 and guided linearly in the direction toward and away from the center of the central hub. In the preferred embodiment, the guide apparatus uses conventional gibs with journal bearings. There are a number of different ways the support member may be guided to accomplish the purpose.

An extension spring 43 is anchored at the mounting end of arm 37 and also to support member 41, such that the spring urges support member 41 toward the central hub. Support member 41 has a cam follower 45 positioned to engage an actuator 47, which is mounted to a base surface 48 of the CVD chamber, such that the moving portion of the wafer seal apparatus may be controlled relative to the CVD chuck.

A wafer seal ring assembly 49 in the preferred embodiment is attached to and carried by moving support member 41. The attachment includes ceramic insulators so the seal ring assembly is electrically and thermally isolated from the support. The seal ring assembly is moved away from CVD chuck 29 at a point in rotation of the central hub where loading and unloading of wafers to the chuck is accomplished, and toward the chuck at other positions of hub rotation. The seal ring assembly contacts wafer 51 on chuck 29 and holds the wafer against the chuck in a manner that prevents CVD coating on the edges and the backside of a wafer.

Figure 4:
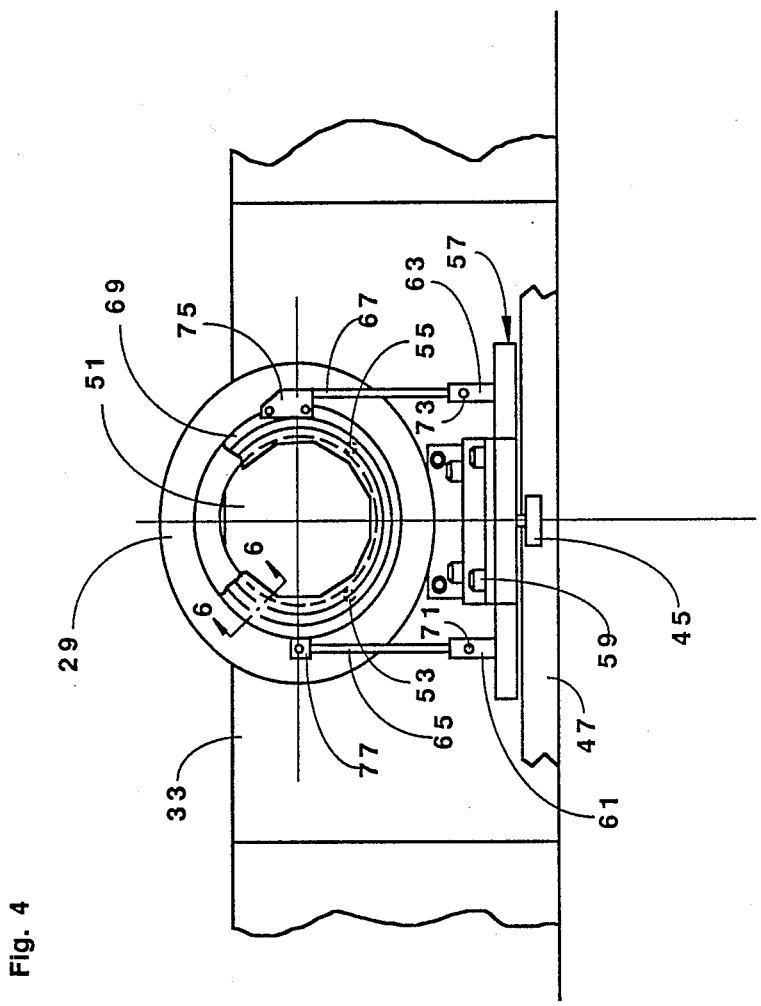
FIG. 4 is a front elevation view of the apparatus of FIG. 3 from the vantage of line 4—4.

FIG. 4 is a view of the apparatus of FIG. 3 in the direction of arrows 4—4 of FIG. 3, showing additional detail of the preferred embodiment. Wafer 51 is shown resting on support pins 53 and 55 on CVD chuck 29, which is attached by arm 31 (not shown) to central hub 33. In the preferred embodiment, the CVD chuck is sized to support a particular wafer size, such as a nominal 6 inch (150 mm.) diameter wafer. To run wafers of a different size, chucks designed to support the new size are installed. This is not a particular inconvenience, as CVD machines in production are typically dedicated to processing wafers of one particular size for long periods of time. Chucks have been built and tested to run wafers from nominal 4 inch (100 mm.), 6 inch (150 mm.), and 8 inch (200 mm.), although wafers of other sizes may also be processed by building chucks and rings of the appropriate dimensions according to the teachings of the invention.

Wafer seal ring assembly 49 (FIG. 3) has a cross-piece 57 fastened to support member 41 upon which other elements of the assembly are supported. In the preferred embodiment, the cross-piece is fastened to support member 41 by socket-head cap screws, such as screw 59. To accomodate wafers of other diameter, assembly 49 may be removed and replaced with an assembly of elements designed for a different wafer size.

Cross-piece 57 has two rod supports 61 and 63 spaced apart to support two rods 65 and 67 to which a seal ring 69 is mounted. Rods 65 and 67 mount in the rod supports in round bores, and are secured by set screws 71 and 73 in the preferred embodiment, so adjustment may be made by loosening the set screws and sliding the rods in and out of the bores, resecuring by tightening the set screws.

The angle that rod supports 61 and 63 make with the vertical toward the central hub is designed to be the same as the angle that the CVD chucks make with vertical toward the inner hub. This is so seal ring 69, as it moves toward and contacts wafer 51 at the CVD chuck will have substantially the same angle as the chuck, and will tend to meet with the wafer all around the periphery of the wafer. There are many adjustments that may be made to assure this even contact, including the fact that the rod members provide a certain amount of flexibility.

Seal ring 69 is fastened to rod member 67 by a plate assembly 75 with screw fasteners. The plate assembly includes a mounting member, not shown, with a bore for rod 67, so seal ring 69 may pivot a limited amount about rod 67 in the preferred embodiment. The attachment of the seal ring to rod 65 in the preferred embodiment is by an adjustment cap 77 with an adjusting screw so that the amount of pivot of ring 69 around rod 67 may be adjusted a small amount, about 1 cm. overall, to assure that ring 69 will meet wafer 51 in substantially the plane of the front surface of the wafer on the CVD chuck.

At the load-unload position of the rotating central hub, where the wafer seal ring assembly is away from the CVD chuck, as shown in FIG. 3, wafers may be placed on the wafer support pins for processing or processed wafers may be removed. Typically, during a loading/unloading sequence, the hub moves as many times as there are CVD chucks extending from the hub, and each chuck is unloaded and then reloaded with an unprocessed wafer.

Figure 5:
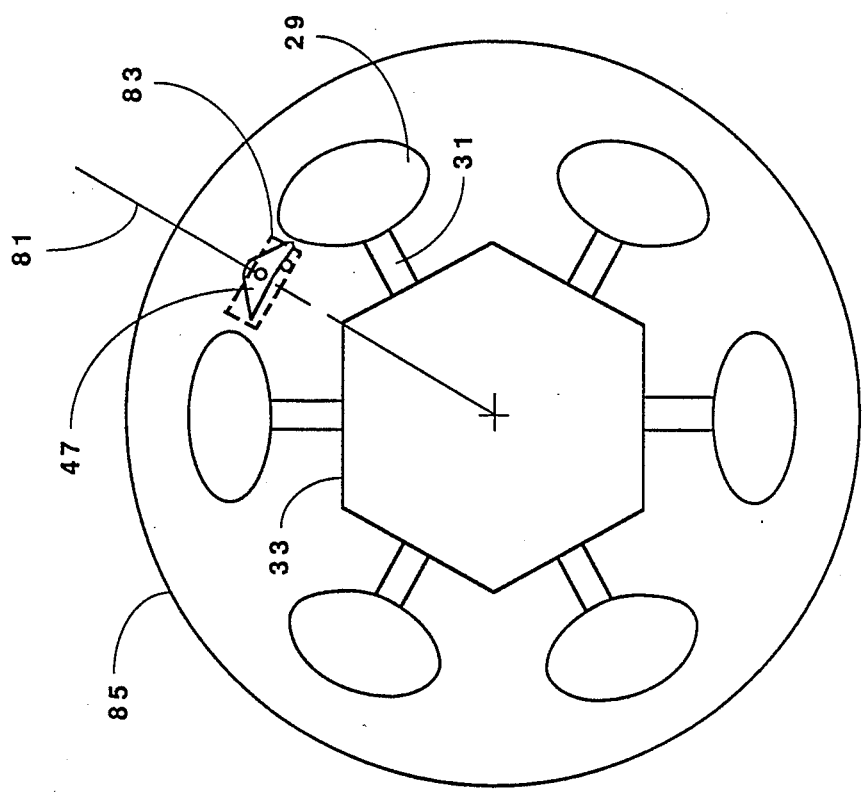
FIG. 5 is a partial plan view of a CVD coating machine with a rotatable central hub and multiple CVD chucks, showing operating mechanism for a preferred embodiment of the invention.

FIG. 5 is a partial plan view of the CVD system of FIGS. 3 and 4, showing six CVD chucks attached to hexagonal central hub 33. CVD chuck 29 on arm 31 is one of the six chucks. The seal ring assembly of the invention is not shown in FIG. 5. Diameter 85 is the outer diameter of a sealable chamber enclosing the process apparatus. The central hub is rotatable both clockwise and counterclockwise. There could be more than six or fewer than six positions for chucks; six has been found to be convenient.

Line 81 in FIG. 5 is the position at which rotation stops for each CVD chuck between processing so that wafers can be unloaded and loaded. Actuator 47 is shown at the load-unload position, where the wafer seal ring apparatus must move away from the chuck so a wafer may be transferred to and away from the chuck. Actuator 47 in the preferred embodiment is a shaped lever, pivoted on surface 48 (FIG. 4), and with stops such that at the load-unload position, with counterclockwise rotation of the central hub, the cam follower for each wafer seal apparatus will ride onto the actuator as a camtrack, and the wafer seal apparatus will be opened, that is, the seal ring assembly will move away from the chuck allowing space for a load-unload arm (not shown) to take a wafer off the chuck and place a new wafer on the chuck. At all other positions the wafer seal rings will be against the respective chuck, or against a wafer on the chuck if a wafer is loaded, urged by the tension spring. At the point that a seal apparatus is aligned with line 81, the apparatus is fully open. Rotation stops for each CVD chuck at the load-unload position while wafer unload and load is accomplished. Area 83, shown as a dashed line, represents a sealable opening into the CVD chamber through which wafers may be inserted and withdrawn. Then, as the hub moves a CVD chuck away from the load-unload position, the shape of the actuator allows the wafer seal apparatus to close again, urged by spring 43, until the seal ring is in contact with a wafer on the chuck, if a wafer is loaded. In a typical process cycle, after all chucks have been unloaded and reloaded, hub rotation is stopped, the chamber is sealed, and CVD processing is initiated.

Because of heater power lines, control lines to transducers, and the like, that must extend into the CVD chucks, the central hub does not rotate in the same direction for more than a single revolution. After a load-unload cycle, rotation is reversed. Clockwise rotation causes cam followers to pivot the actuator lever out of the way so that the cam followers pass to the hub side without opening the wafer seal apparatus.

The plan view of FIG. 5 represents a typical case. There could be more than six CVD chucks, or fewer. There are a number of ways the actuator could operate. There could be many other differences as well. For example, wafers might be loaded and unloaded to the process chamber from an air-lock chamber or other type of holding chamber.

When wafer seal ring assembly 49 of FIG. 3 and FIG. 4 is closed, away from the load-unload position, seal ring 69 is urged against wafer 51, on the CVD chuck, if a wafer has been loaded to the chuck before the seal ring apparatus closes. If no wafer is loaded, the ring will press against the chuck. Wafer 51 represents any wafer that is on the chuck when the apparatus closes.

Figure 6:
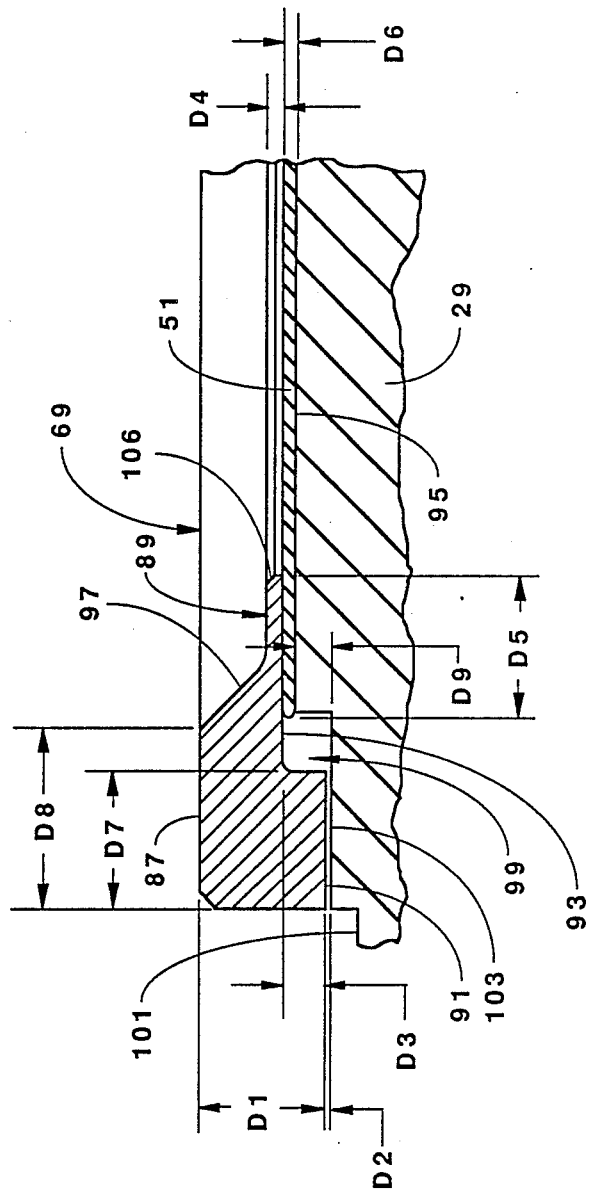
FIG. 6 is a partial section through a portion of a CVD chuck, a wafer, and the seal ring of the invention, taken along line 6—6 of FIG. 5.

FIG. 6 is a partial section through ring 69, wafer 51, and a part of chuck 29, along line 6—6 of FIG. 4. In FIG. 6 the wafer seal apparatus is closed, and the seal ring is urged against a wafer on the chuck with a force of about 10 pounds for a wafer with a 4 inch nominal diameter.

The face of CVD chuck 29 has three levels in the preferred embodiment: a base level 101, a first raised surface 103, and a second raised surface 95. The first raised surface is circular and has an outer diameter substantially the same as the outer diameter of wafer seal ring 69. Raised surface 95 is substantially the size of the backside of a wafer to be processed, and differs in size for chucks made to accomodate different wafers. When a wafer is loaded to the CVD chuck, the wafer rests against surface 95. Although surface 95 has the same diameter as the wafer to be loaded, it has no complementary shape to wafer flats that are formed on the edge of wafers for orientation and identification purposes. In the preferred mode, surfaces 103 and 95 are carefully machined and polished to be flat within about 0.001 inch over the expanse of each surface.

Wafer seal ring 69 has an outer portion 87 with a thickness D1 in the preferred embodiment of about 12 mm. and a flat machined surface 91 orthogonal to the axis of the seal ring. Width D7 of surface 91 in the diametric direction is about 10.5 mm. in the preferred embodiment, and is the same regardless of the diameter differences in rings and chucks to accomodate different wafer sizes.

The seal ring has an inner portion 89 with a flat machined surface 93 parallel to surface 91. Surface 93 is the surface that contacts the frontside of a wafer when the seal apparatus closes. Surface 93 extends toward the ring center to an extent that an overlap D5 of between 3 and 5 mm. is created, and the inner periphery is machined as a series of flats (see FIG. 4) so that a wafer with any standard flat of the nominal diameter for which a chuck and seal ring have been prepared, may be loaded and contacted by the seal ring continuously around the outer periphery of the wafer. It is important that contact with the wafer be continuous.

The spacing D3 between surfaces 91 and 93 is controlled in machining relative to distance D9 that surface 95 is raised above surface 103 and the thickness D6 of wafer 51 to control the gap dimension D2 between surface 103 of the CVD chuck and surface 91 of the wafer seal ring. For example, for a nominal 4 inch diameter wafer with the apparatus of the preferred embodiment, D3 is 0.172 inches plus or minus 0.0005 inches, wafer thickness D6 is known to vary from 0.0237 to 0.0255 inch, and D9 is 0.150 inches plus or minus 0.0005 inches. The maximum gap D2 is the maximum wafer thickness 0.0255 inches, plus the maximum D9 dimension of 0.1505, less the minimum D3 dimension of 0.1715 inches, or D2=0.0045 inches. The minimum gap D2 is the minimum wafer thickness 0.0237 inches, plus the minimum D9 dimension of 0.1495 inches, less the maximum D3 dimension of 0.1725 inches, or D2=0.0007 inches. In measurements of a system in use with tolerances equal to those described above for a 4 inch nominal wafer, the gap width D2 was found to vary from 0.0012 inches to 0.004 inches; a very good correlation in practice to theoretical tolerances. The width D7 of surface 91 together with gap D2 between surface 91 and surface 103 forms a perimeter proximity seal around the wafer on the chuck, which, together with the continuous contact between surface 93 and the frontside of the wafer around the perimeter of the wafer, precludes CVD coating on the edges of the wafer. In addition, the force exerted on the wafer by the seal ring assures that the wafer is held flat to surface 95 of the chuck. Edge and backside coating are eliminated.

The outer diameter of surface 93 of the seal ring has to be greater than the maximum outer diameter of the wafers to be processed, and a volume 91 is enclosed between the edge of the wafer and edge 105 of the seal ring. The width of this volume provides clearance for operation, and must also be greater than the diameter of each of pins 53 and 55 that support a wafer when the wafer seal apparatus is open. The pins in the preferred embodiment fit in holes in surface 103 adjacent to the outer diameter of raised surface 95. The pins extend beyond the D9 dimension by an amount somewhat less than the thickness of a wafer, so they may support a wafer in the absence of the seal ring, but do not interfere with the closing of the seal ring to contact the frontside of the wafer around the outer perimeter of the wafer. A width of about 6 mm. is used in the preferred embodiment.

Outer portion 87 of seal ring 69 is joined to inner portion 89 by an angled surface 97. In the preferred embodiment dimension D8 is about 15 mm. and the angle of surface 97 with the axis of the ring is about 45 degrees. It has been found that an angle is important in many CVD processes to avoid interference with flow of gases to the frontside of the wafer, causing an uneven distribution of deposited material. The angle, however, can be as small as 20 degrees, and may begin almost at the inner periphery of the seal ring. The thickness D4 of the inner portion of the seal ring in the preferred embodiment is 0.040 inches, with a chamber 106 of about 0.020 inches by 45 degrees. The relatively thin section and the chamber both help to avoid disturbance in the flow of CVD gases to the frontside of the wafer during processing, especially near the area of contact with the frontside of the wafer. The more massive outer portion of the ring provides stability during temperature excursions that might otherwise warp or fracture the ring. The ring material, like the chuck material, is monel metal in the preferred embodiment.

In preparing to process a number of wafers that have been loaded to a CVD system, the volume of the CVD chamber is evacuated, establishing a vacuum. The vacuum level between deposition cycles is typically about 1 millitorr. To initiate deposition, it is necessary to bleed CVD gases into the chamber. A typical deposition pressure is from 200 to 300 millitorr. When gas is first bled into the CVD chamber there is a pressure differential between the volume 99 around the edge of a wafer clamped on a chuck by a wafer seal ring and the rest of the CVD chamber. This pressure differential will cause gas to flow through gap D2 of the perimeter proximity seal into volume 99. The flow will gradually decrease over time, because the pressure will rise in volume 99 decreasing the pressure difference toward equilibrium. To avoid introduction of gas to volume 99 that would cause deposition on the wafer edge, the first gas introduced before deposition begins is a relatively inert gas, such as nitrogen; a gas that will not cause deposition. The gas bearing the material to be deposited, such as tungsten hexaflouride for a deposition of tungsten or an alloy of tungsten, is introduced only after enough time has passed for pressure equilibrium to be established between the chamber and the small volume 99 around the edge of wafers on the chucks.

Hence it is believed that the only mechanism by which material might enter volume 99 and cause deposition on the edge or the backside of a wafer is by diffusion. The material in CVD processing is introduced as a gas, such as tungsten hexaflouride for tungsten or silane for silicon deposition. The CVD chuck and the ring are at a high temperature, such as 400 to 600 degrees Centigrade. The CVD gas bearing the material to be coated will tend to migrate in the D2 gap of the perimeter proximity seal due to molecular action at the high temperature, but will also tend to coat on chuck surface 103 and ring surface 91 in the gap. If gap dimension D2 is relatively small, and gap width D7 is relatively large, there will be a high probability of collisions of gas molecules with surfaces 103 and 91 and a high probability of depletion of the coating material in the gap before reaching volume 99, where coating might be on the edge of a wafer.

It has been found in trial depositions that with a dimension D7 of 10.67 mm. (0.420 inches) for the perimeter proximity seal, that the gap D2 can vary from 0 to about 0.279 mm. (0.011 inches), before any signs of edge coating appear. This is a ratio of width to length of about 38:1. Generally it has been found that to be effective, the perimeter proximity seal should have a width to gap ratio of more than 35:1, preferrably more than 38:1, and most preferred, a ratio of about 80:1 or higher.

As a practical matter, a gap of 0 is not attainable, because of the realities of machining tolerances, and the fact that interference (touching) of surfaces 91 and 103 means that pressure is relieved on the face of the wafer, and surface 93 will not everywhere contact the wafer. Dimensions are controlled so the D2 gap of the perimeter proximity seal is not less than about 0.001 inch. It is preferable to operate with a larger gap respecting the 35:1 ratio of width to gap dimension, because as material deposits in the gap, the gap becomes smaller, until it is necessary to pause for a cleaning operation to restore the original dimensions and tolerances.

Cleaning is typically done by backfilling the chamber with argon and sputtering deposited material off the hubs, rings, and fixtures via an RF plasma. When this RF cleaning is done, the hubs, the chuck and the rings are RF hot, while the guide portions of the apparatus are RF floating, and therefor not attacked by the plasma. This is accomplished by the ceramic insulators above described in the perimeter wafer seal apparatus.

It has also been found in practice that the wafer seal ring must be at approximately the temperature of the chuck and the wafer during deposition to avoid disturbance of the coating uniformity on the front surface of the wafer. If the ring is at a lower temperature, it will act as a heat sink, drawing heat from the wafer, and lowering the wafer surface temperature near the area of contact between the ring and the wafer. The lower temperature lowers the reaction rate and causes less material to be deposited. Accordingly, time is always allowed in the cycle to insure that temperature equilibrium is established before production coating is commenced.

Wafers to be coated are not always perfectly flat. Moreover, wafers may tend to warp and curl even more due to temperature gradients and the tendency of the wafer material, like most other materials, to expend with higher temperature. For this reason the pressure with which seal ring 69 is urged against a wafer must be controlled. For smaller wafers, the pressure can generally be less than for larger wafers. It has been found in practice that a force of about 10 pounds is the minimum needed for smaller wafers and a maximum of 40 pounds is enough for larger wafers. The force is controlled in the preferred embodiment by choice of spring 43, and the prestretch of the spring. With apparatus of the preferred embodiment coating is only on the frontside of a wafer, within the perimeter of portion 89 of seal ring 69. Since a sputtered adhesion layer may be applied in a single operation over all of the frontside of a wafer in a relatively simple sputtering apparatus, there is no need for complicated sputtering to coat wafer edges with the adhesion layer material or extra operations and handling to coat the backside of a wafer with the adhesion layer material.

It will be apparent to one skilled in the art that there are many changes that may be made in the apparatus of the invention without departing from the spirit and scope of the invention. The mechanism used to move the seal ring toward and away from the CVD chucks may, for example, take many forms. The device to urge the mechanism closed need not be a tension spring just as shown in the preferred embodiment. There are arrangements that could use a compression spring, or the mechanism could follow a camtrack with positive location to the camtrack and no spring at all. As another example, the width of the proximity seal may vary, as long as the minimum ratio of width to length is observed. Also, a proximity seal could be embossed or channels could be imposed. It is not necessary that the seal be flat, only that the seal have considerable length relative to separation. Proximity seals with complicated shapes should not be thought of as departing from the spirit and scope of the invention. It is not necessary, either, that surface 95 be raised above surface 103 on the chuck. Dimension D3 could be predicated by the wafer thickness alone. Raising surface 95 is a convenience for machining purposes. The exact shape of the ring might vary as well, from the preferred embodiment described, and materials could vary, as long as compatibility with process is kept in mind. There are many other changes that could be made without departing from the spirit and scope of the invention.

What is claimed is:

1. An apparatus for preventing edge and backside coating on a wafer on a CVD chuck during a CVD process comprising:
    a wafer seal ring for holding said wafer against said CVD chuck; and
    carrier means attached to said wafer seal ring for supporting and moving said wafer seal ring;
    said wafer seal ring contacting said wafer continuously around the periphery of said wafer on the side of said wafer away from said CVD chuck, and extending beyond the periphery of said wafer and close to a surface of said CVD chuck, thereby forming a perimeter proximity seal with said surface of said CVD chuck outside the periphery of said wafer, for substantially excluding coating on the edge and backside of said wafer.

2. An apparatus as in claim 1 comprising;
    guide means attached to said carrier means for guiding said carrier means toward and away from said CVD chuck to guide said wafer seal ring toward and away from said wafer on said CVD chuck;
    actuator means for advancing said carrier means toward said CVD chuck and for retracting said carrier means from said CVD chuck; and
    pressure means associated with said carrier means for pressing said wafer seal ring against said wafer on said CVD chuck.

3. An apparatus as in claim 1 wherein said perimeter proximity seal comprises a first surface on said seal ring and a second surface on said CVD chuck, said first surface substantially conforming in shape to said second surface and separated from said second surface by a dimension X over a length Y such that the ratio of Y:X is everywhere equal to or greater than 35:1.

4. An apparatus as in claim 3 wherein said first surface and said second surface are both flat surfaces.

5. An apparatus as in claim 2 wherein said guide means comprises a linear slide in journal bearings.

6. An apparatus as in claim 2 wherein said pressure means comprises a tension spring attached to said carrier means and to said guide means.

7. A wafer seal ring for holding a wafer against a CVD chuck during CVD processing comprising:
    a first surface orthogonal to the axis of said ring for contacting the front side of said wafer and urging said wafer against said CVD chuck; and
    a second surface extending beyond the periphery of said wafer and close to a surface of said CVD chuck, thereby forming a perimeter proximity seal with said surface of said CVD chuck outside the periphery of said wafer, for substantially excluding coating on the edge and backside of said wafer.

8. A wafer seal ring as in claim 7 wherein said second surface is a flat surface and parallel to said first surface.

9. A method of preventing CVD deposition on the edge and backside of a wafer on a CVD chuck during CVD processing comprising the steps of:
    placing a seal ring over said wafer; and
    urging said seal ring against said wafer to press the backside of said wafer against said CVD chuck;
    said seal ring contacting the frontside of said wafer continuously around the periphery of said wafer and extending beyond the periphery of said wafer and close to a surface of said CVD chuck, thereby forming a perimeter proximity seal with said surface of said CVD chuck outside the periphery of said wafer, for substantially excluding coating on the edge and backside of said wafer.

10. A system for performing a CVD process on a wafer comprising:
    a CVD chamber;
    a rotatable hub within said CVD chamber;
    a CVD chuck attached to said rotatable hub; and a perimeter wafer seal apparatus attached to said hub;
    said perimeter wafer seal apparatus comprising:
        a wafer seal ring for holding said wafer against said CVD chuck; and
        carrier means attached to said wafer seal ring for supporting and moving said wafer seal ring;
        said wafer seal ring contacting said wafer continuously around the periphery of said wafer on the side of said wafer away from said CVD chuck, and extending beyond the periphery of said wafer and close to a surface of said CVD chuck, thereby forming a perimeter proximity seal with said surface of said CVD chuck outside the periphery of said wafer, for substantially excluding coating on the edge and backside of said wafer.

11. A system as in claim 10 comprising:
    guide means attached to said carrier means for guiding said carrier means toward and away from said CVD chuck to guide said wafer seal ring toward and away from said wafer on said CVD chuck;
    actuator means for advancing said carrier means toward said CVD chuck and for retracting said carrier means from said CVD chuck; and
    pressure means associated with said carrier means for pressing said wafer seal ring against said wafer on said CVD chuck.

12. A system as in claim 11 comprising a cam follower attached to said carrier means wherein said actuator means comprises a cam lever such that rotation of said rotatable hub actuates said perimeter wafer seal apparatus through contact of said cam follower with said cam lever.

13. A system as in claim 12 wherein said cam lever is a pivoted cam lever such that rotation of said hub in one direction actuates said perimeter wafer seal apparatus, but rotation of said hub in the other direction does not actuate said perimeter wafer seal apparatus, said pivoted cam lever being pivoted such that said cam follower does not follow said cam lever.

* * * * *